US010903073B2

United States Patent
Kim et al.

(10) Patent No.: US 10,903,073 B2
(45) Date of Patent: Jan. 26, 2021

(54) SYSTEMS AND METHODS OF DISLOCATION FILTERING FOR LAYER TRANSFER

(71) Applicant: Massachusetts Institute of Technology, Cambridge, MA (US)

(72) Inventors: Jeehwan Kim, Cambridge, MA (US); Kyusang Lee, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/348,125

(22) PCT Filed: Nov. 8, 2017

(86) PCT No.: PCT/US2017/060568
§ 371 (c)(1),
(2) Date: May 7, 2019

(87) PCT Pub. No.: WO2018/089444
PCT Pub. Date: May 17, 2018

(65) Prior Publication Data
US 2019/0259608 A1    Aug. 22, 2019

Related U.S. Application Data

(60) Provisional application No. 62/418,964, filed on Nov. 8, 2016.

(51) Int. Cl.
*H01L 29/15* (2006.01)
*H01L 21/02* (2006.01)
(Continued)

(52) U.S. Cl.
CPC .. *H01L 21/02444* (2013.01); *H01L 21/02389* (2013.01); *H01L 21/02455* (2013.01);
(Continued)

(58) Field of Classification Search
CPC ......... H01L 21/02444; H01L 21/02389; H01L 21/02455; H01L 21/02485; H01L 21/02502
See application file for complete search history.

(56) References Cited

U.S. PATENT DOCUMENTS

| 4,236,947 A | 12/1980 | Baliga |
| 4,471,367 A * | 9/1984 | Chen ............... H01L 29/475 257/192 |

(Continued)

FOREIGN PATENT DOCUMENTS

| WO | WO 2013/088948 A1 | 6/2013 |
| WO | WO 2014/190352 A1 | 11/2014 |

(Continued)

OTHER PUBLICATIONS

Extended European Search Report dated May 28, 2020 for Application No. EP17869789.2.
(Continued)

*Primary Examiner* — Phuc T Dang
(74) *Attorney, Agent, or Firm* — Wolf, Greenfield & Sacks, P.C.

(57) ABSTRACT

A method of manufacturing a semiconductor device includes forming a first epitaxial layer on a first substrate. The first substrate includes a first semiconductor material having a first lattice constant and the first epitaxial layer includes a second semiconductor material having a second lattice constant different from the first lattice constant. The method also includes disposing a graphene layer on the first epitaxial layer and forming a second epitaxial layer comprising the second semiconductor material on the graphene layer. This method can increase the substrate reusability, increase the release rate of functional layers, and realize precise control of release thickness.

13 Claims, 6 Drawing Sheets

(51) Int. Cl.
  *H01L 21/683* (2006.01)
  *H01L 21/762* (2006.01)
(52) U.S. Cl.
  CPC .. *H01L 21/02458* (2013.01); *H01L 21/02485* (2013.01); *H01L 21/02502* (2013.01); *H01L 21/683* (2013.01); *H01L 21/762* (2013.01); *H01L 21/02392* (2013.01)

(56) References Cited

U.S. PATENT DOCUMENTS

| | | | |
|---|---|---|---|
| 4,727,047 | A | 2/1988 | Bozler et al. |
| 5,114,745 | A | 5/1992 | Jones |
| 5,308,661 | A | 5/1994 | Feng et al. |
| 5,349,922 | A | 9/1994 | Anthony et al. |
| 5,391,257 | A * | 2/1995 | Sullivan .......... H01L 21/76251 117/915 |
| 5,527,559 | A | 6/1996 | Simpson |
| 5,641,381 | A | 6/1997 | Bailey et al. |
| 5,792,254 | A | 8/1998 | Windischmann |
| 6,566,256 | B1 | 5/2003 | Solomon et al. |
| 8,906,772 | B2 | 12/2014 | Sumant |
| 8,916,451 | B2 | 12/2014 | Bayram et al. |
| 9,096,050 | B2 | 8/2015 | Bedell et al. |
| 9,991,113 | B2 | 6/2018 | Kim et al. |
| 10,517,155 | B2 | 12/2019 | Lee et al. |
| 10,770,289 | B2 | 9/2020 | Kim |
| 2005/0023646 | A1* | 2/2005 | Lee ................. H01L 21/02381 257/616 |
| 2005/0109918 | A1 | 5/2005 | Nikzad et al. |
| 2006/0021565 | A1 | 2/2006 | Zahler et al. |
| 2007/0187694 | A1 | 8/2007 | Pfeiffer |
| 2009/0045395 | A1 | 2/2009 | Kim et al. |
| 2009/0162549 | A1 | 6/2009 | Fryda et al. |
| 2009/0236619 | A1 | 9/2009 | Chakroborty |
| 2010/0224950 | A1 | 9/2010 | Dinyari et al. |
| 2011/0030991 | A1 | 2/2011 | Veerasamy |
| 2011/0108954 | A1 | 5/2011 | Spiberg et al. |
| 2011/0244662 | A1 | 10/2011 | Lee et al. |
| 2011/0294281 | A1 | 12/2011 | Zang et al. |
| 2012/0141799 | A1 | 6/2012 | Kub et al. |
| 2012/0238083 | A1 | 9/2012 | Pan |
| 2013/0001731 | A1 | 1/2013 | Forrest et al. |
| 2013/0143397 | A1 | 6/2013 | Fuller et al. |
| 2013/0285016 | A1 | 10/2013 | Wei et al. |
| 2013/0285115 | A1 | 10/2013 | Wei et al. |
| 2013/0288458 | A1* | 10/2013 | Wei ......................... B82Y 40/00 438/478 |
| 2013/0316488 | A1 | 11/2013 | Bedell et al. |
| 2014/0001152 | A1 | 1/2014 | Zurutuza Elorza et al. |
| 2014/0038392 | A1 | 2/2014 | Yonehara et al. |
| 2014/0220764 | A1 | 8/2014 | Bayram et al. |
| 2014/0291282 | A1 | 10/2014 | Bedell et al. |
| 2014/0339580 | A1 | 11/2014 | Park et al. |
| 2014/0342127 | A1 | 11/2014 | Dimitrakopoulos et al. |
| 2015/0084074 | A1 | 3/2015 | Bayram et al. |
| 2015/0122659 | A1 | 5/2015 | Kula et al. |
| 2015/0179968 | A1 | 6/2015 | Forrest et al. |
| 2015/0228728 | A1 | 8/2015 | Dimitrakopoulos et al. |
| 2016/0028022 | A1 | 1/2016 | Seo |
| 2016/0064489 | A1 | 3/2016 | Zhang et al. |
| 2016/0126317 | A1 | 5/2016 | Kim et al. |
| 2016/0268128 | A1 | 9/2016 | Cheng et al. |
| 2016/0329457 | A1 | 11/2016 | Forrest et al. |
| 2016/0333472 | A1 | 11/2016 | Xu et al. |
| 2016/0351747 | A1 | 12/2016 | Forrest et al. |
| 2017/0018614 | A1 | 1/2017 | Rupp et al. |
| 2017/0352538 | A1 | 12/2017 | Kim et al. |
| 2018/0197736 | A1 | 7/2018 | Kim |
| 2019/0386044 | A1 | 12/2019 | Lee et al. |
| 2020/0043790 | A1 | 2/2020 | Lee et al. |

FOREIGN PATENT DOCUMENTS

| | | |
|---|---|---|
| WO | WO 2016/058037 A1 | 4/2016 |
| WO | 2017/044577 A1 | 3/2017 |
| WO | WO 2017/222796 A2 | 12/2017 |
| WO | WO 2018/195152 A1 | 10/2018 |
| WO | WO 2018/195412 A1 | 10/2018 |
| WO | WO 2019/099461 A1 | 5/2019 |

OTHER PUBLICATIONS

Adams et al., Demonstration of multiple substrate reuses for inverted metamorphic solar cells. IEEE J Photovolt. 2013;3(2):899-903. 6 pages.

Ait-Mansour et al., Ge epitaxial island growth on a graphitized C-rich 4H-SiC(0 0 0 1) surface. J Cryst Growth. Feb. 2005;275(1-2):e2275-80. Epub Jan. 7, 2005.

Alaskar et al., Theoretical and experimental study of highly textured GaAs on silicon using a graphene buffer layer. J Crystal Growth. Sep. 1, 2015;425:268-73. Epub Feb. 9, 2015.

Avouris et al., Graphene: synthesis and applications. Materials Today. Mar. 2012;15(3):86-97.

Balmer et al., Chemical vapour deposition synthetic diamond: Materials, technology and applications. J Phys Condens Matter. Aug. 2009;21(346):364221(1-3).

Barton et al., Transition metal dichalcogenide and hexagonal boron nitride heterostructures grown by molecular beam epitaxy Microelectronic Engineering. 2015;147:306-9. doi: 10.1016/j.mee.2015.04.105. Epub May 5, 2015.

Bedell et al., Vertical light-emitting diode fabrication by controlled spalling. Appl Phys Exp. 2013;6(11):112301(1-4). Epub Oct. 18, 2013.

Bedell et al., Layer transfer by controlled spalling. J Phys D: Appl Phys. 2013;46(15):152002(1-6).

Bedell et al., Kerf-less removal of Si, Ge, and III-V layers by controlled spalling to enable low-cost PV technologies. IEEE J Photovolt. Apr. 2012;2(2):141-7.

Berger et al., Ultrathin epitaxial graphite:? 2D electron gas properties and a route toward graphene-based nanoelectronics. J Phys Chem B. 2004;108(52):19912-6. Epub Dec. 3, 2004.

Cheng et al., Epitaxial lift-off process for gallium arsenide substrate reuse and flexible electronics. Nat Commun. 2013;4:1577(1-7). Epub MAr. 12, 2013.

Chung et al., Transferable GaN layers grown on ZnO-coated graphene layers for optoelectronic devices. Science. Oct. 29, 2010;330(6004):655-7. doi: 10.1126/science.1195403.

De Heer et al., Epitaxial graphene. Solid State Commun. 2007;143(1-2):92-100. Epub Apr. 27, 2007.

Diebold et al., Growth and characterization of GaAs on Sapphire (0001) by molecular beam epitaxy. Surf Interf Anal. Feb. 1990;15(2):150-8.

Distler, The real structure of crystals and selective nucleation at surface local long range active centres. J Cryst Growth. 1968;3:175-9.

Distler et al., Polarization structure of interfacial amorphous films. Nature. Jan. 4, 1969;221:52-3.

Distler et al., Oriented crystallization of AgCl on amorphous polyvinyl chloride replicas of NaCl single crystal surfaces. Thin Solid Films. 1970;6:203-11.

Emtsev et al., Towards wafer-size graphene layers by atmospheric pressure graphitization of silicon carbide. Nat Mater. Mar. 2009;8(3):203-7. doi: 10.1038/nmat2382. Epub Feb. 8, 2009.

Freund et al., Thin film materials: Stress, defect formation and surface evolution. Cambridge Univ Press. 2009. 820 pages.

Greaving, Fabrication and characterization of diamond thin films as nanocarbon transistor substrates. Master's Thesis. Vanderbilt University. 48 pages. Aug. 2013.

Henning, Orientation of vacuum condensed overgrowths through amorphous layers. Nature. Sep. 12, 1970;227:1129-31.

Iida et al., Laser lift-off technique for freestanding GaN substrate using an in droplet formed by thermal decomposition of GaInN and

(56) References Cited

OTHER PUBLICATIONS its application to light-emitting diodes. Appl Phys Lett. 2014;105:072101(1-4). Epub Aug. 18, 2014.
Kayes et al., Flexible thin-film tandem solar cells with >30% efficiency. IEEE J Photovolt. Mar. 2014;4(2):729-33.
Kim et al., Engineering of contact resistance between transparent single-walled carbon nanotube films and a-Si:H single junction solar cells by gold nanodots. Adv Mater. Apr. 10, 2012;24(14):1899-902. doi: 10.1002/adma.201104677. Epub Mar. 5, 2012.
Kim et al., 9.4% efficient amorphous silicon solar cell on high aspect-ratio glass microcones. Adv Mater. Jun. 2014;26(24):4082-6. Epub Mar. 20, 2014.
Kim et al., High efficiency Cu2ZnSn(S,Se)4 solar cells by applying a double In2S3/CdS emitter. Adv Mater. Nov. 2014;26(44):7427-31. Epub Aug. 25, 2014.
Kim et al., Fabrication of dislocation-free tensile strained Si thin films using controllably oxidized porous Si substrates. Appl Phys Lett. 2006;89(15):152117(1-3). Epub Oct. 12, 2006.
Kim et al., A method for fabricating dislocation-free tensile-strained SiGe films via the oxidation of porous Si substrates. Appl Phys Lett. 2007;91(25):252108(1-3). Epub Dec. 19, 2007.
Kim et al., 10.5% efficient polymer and amorphous silicon hybrid tandem photovoltaic cell. Nat Commun. 2015;6:6391(1-6). doi: 10.1038/ncomms7391. 6 pages. Epub Mar. 4, 2015.
Kim et al., Layer-resolved graphene transfer via engineered strain layers. Science. Nov. 15, 2013;342(6160):833-6.
Kobayashi et al., Layered boron nitride as a release layer for mechanical transfer of GaN-based devices. Nature. Apr. 12, 2012;484:223-7.
Koma et al., Van der Waals epitaxy for highly lattice-mismatched systems. J Cryst Growth. 1999;201-202:236-41.
Koma et al., Fabrication and characterization of heterostructures with subnanometer thickness. Microelectron Eng. Oct. 1984;2(1-3):129-36.
Lee et al., Natural substrate lift-off technique for vertical light-emitting diodes. Appl Phys Exp. 2014;7(4):042103(1-4). Epub Mar. 14, 2014.
Lee et al., Reuse of GaAs substrates for epitaxial lift-off by employing protection layers. J Appl Phys. 2012;111(3):033527(1-6). Epub Feb. 15, 2012.
Lee et al., Wafer-scale growth of single-crystal monolayer graphene on reusable hydrogen-terminated germanium. Science. Apr. 18, 2014;344(6181):286-9.
Lin et al., Direct synthesis of van der Waals solids. ACS Nano. Apr. 22, 2014;8(4):3715-23. doi:10.1021/nn5003858. Epub Mar. 18, 2014.
Loher et al., Van der Waals epitaxy of three-dimensional CdS on the two-dimensional layered substrate MoTe2(0001). Appl Phys Lett. Aug. 1, 1994;65(5):555-7.
Nakamura et al., GaN growth using GaN buffer layer. Jap J Appl Phys. Oct. 1991;30(10A):L1705-7.

Schlaf et al., Molecular beam epitaxy growth of thin films of SnS2 and SnSe2 on cleaved mica and the basal planes of single-crystal layered semiconductors: Reflection high-energy electron diffraction, low-energy electron diffraction, photoemission, and scanning tunneling microscopy/atomic force microscopy characterization. J Vac Sci Technol A. May/Jun. 1995;13(3):1761-7.
Shahrjerdi et al., Ultralight high-efficiency flexible InGaP/(in)GaAs tandem solar cells on plastic. Adv Energy Mater. May 2013;3(5):566-71.
Shahrjerdi et al., Extremely flexible nanoscale ultrathin body silicon integrated circuits on plastic. Nano Lett. 2013;13:315-20. Epub Dec. 18, 2012.
Suo et al., Steady-state cracking in brittle substrates beneath adherent films. Int J Solid Structures. 1989;25(11):1337-53.
Tanaka et al., Anisotropic layer-by-layer growth of graphene on vicinal SiC(0001) surfaces. Phys Rev B. Jan. 2010;81(4):041406R(1-4).
Thouless et al., The edge cracking and spalling of brittle plates. Acta Metall. 1987;35(6):1333-41.
Ueda et al., Separation of thin GaN from sapphire by laser lift-off technique. Jap J Appl Phys. 2011;50(4R):041001(1-6). Epub Apr. 20, 2011.
Ueno et al., Epitaxial growth of transition metal dichalcogenides on cleaved faces of mica. J Vac Sci Technol A. Jan./Feb. 1990;8(1):68-72.
Vishwanath et al., Controllable growth of layered selenide and telluride heterostructures and superlattices using molecular beam epitaxy. J Mater Res. Apr. 14, 2016;31(7):900-10.
Wang et al., Direct growth of graphene film on germanium substrate. Sci Rep. 2013;3:2465(16). doi: 10.1038/srep02465. Epub Aug. 19, 2013.
Yablonovitch et al., Extreme selectivity in the lift-off of epitaxial GaAs films. Appl Phys Lett. Dec. 28, 1987;51(26):2222-4.
Invitation to Pay Additional Fees dated Jan. 18, 2018 for Application No. PCT/US2017/060568.
International Search Report and Written Opinion dated Mar. 9, 2018 for Application No. PCT/US2017/060568.
International Preliminary Report on Patentability dated May 23, 2019 for Application No. PCT/US2017/060568.
Chun et al., Vertically Stacked Color Tunable Light-Emitting Diodes Fabricated Using Wafer Bonding and Transfer Printing. ACS Appl Mater Interfaces. Nov. 3, 2014;6:19482-7. doi:dx.doi.org/10.1021/am505415q.
Kim et al., Principle of direct van der Waals epitaxy of single-crystalline films on epitaxial graphene. Nat Commun. Sep. 2014;5:4836. doi:10.1038/ncomms5836, 7 pages.
Kong et al., Polarity governs atomic interaction through two-dimensional materials. Nat Mater. Nov. 2018;17:999-1005.
Nicoara et al. Growth of ordered molecular layers of PTCDA on Pb/Si(111) surfaces: a scanning tunneling microscopy study. Nanotechnology. Sep. 9, 2016;27(36):365706. 13 pages. doi: 10.1088/0957-4484/27/36/365706. Epub Aug. 2, 2016.

\* cited by examiner

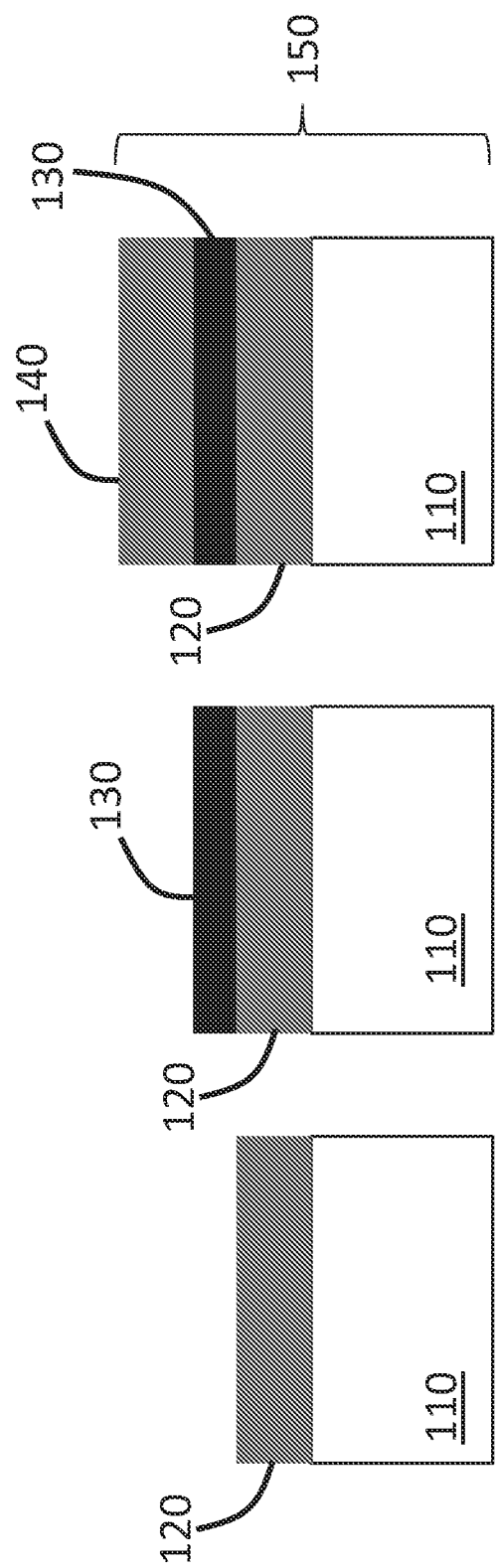

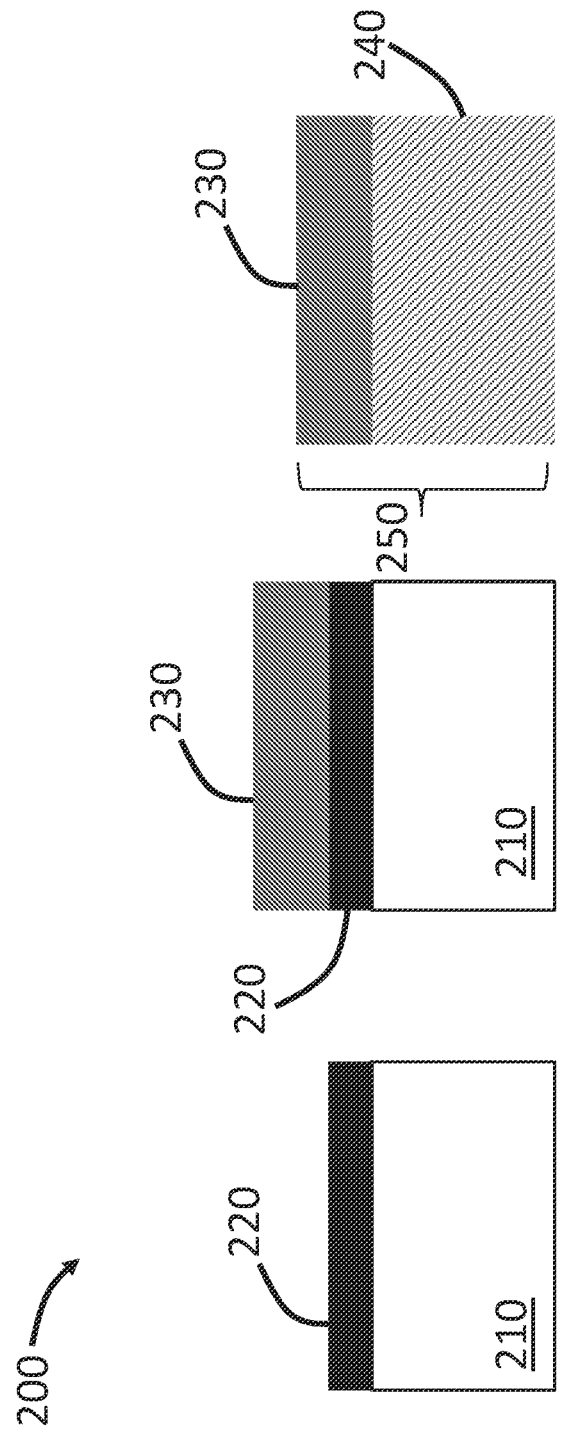

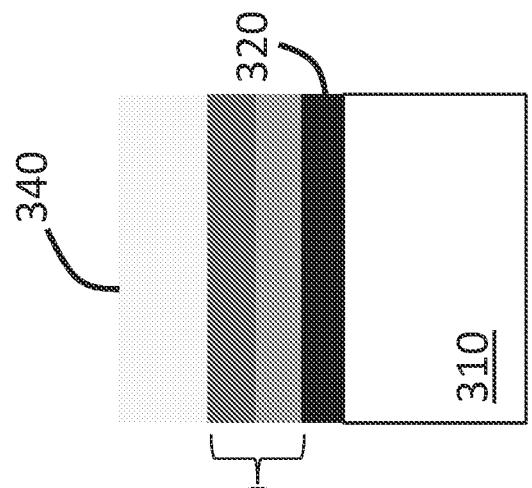
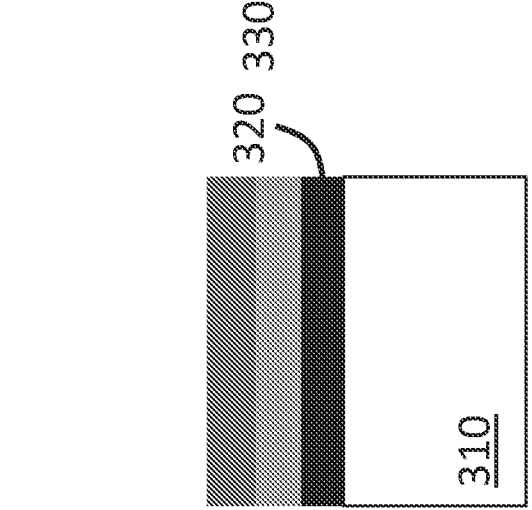
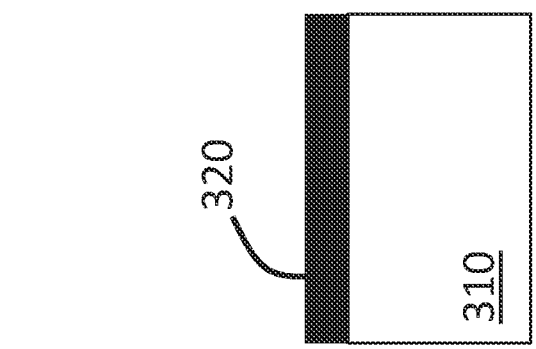

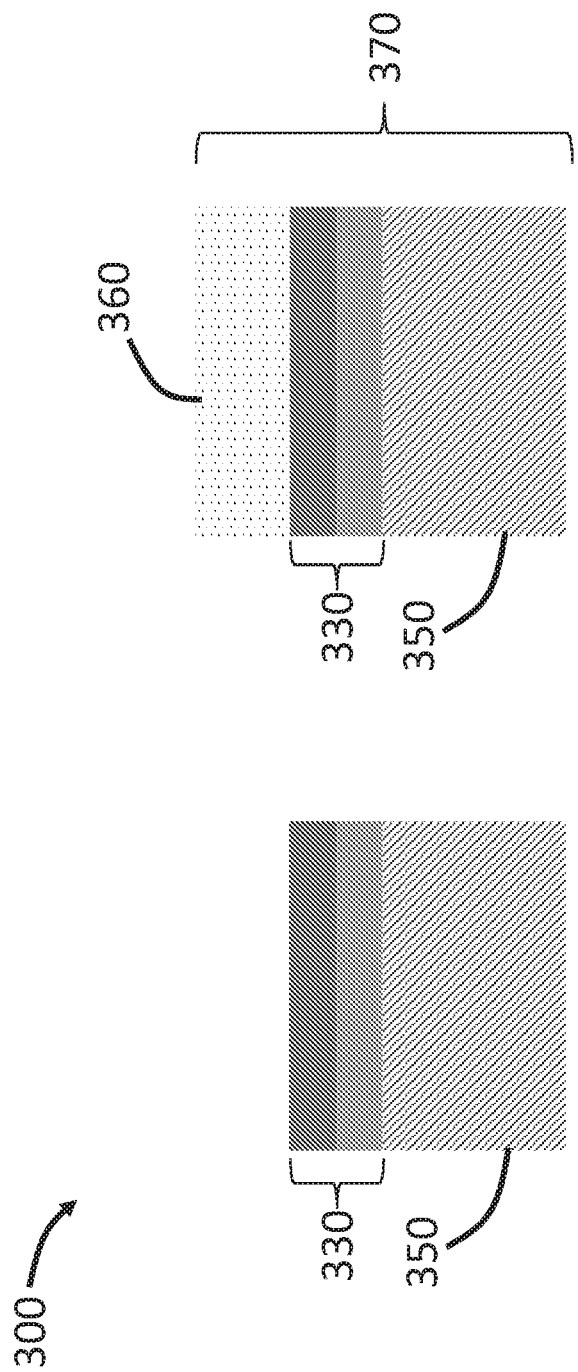

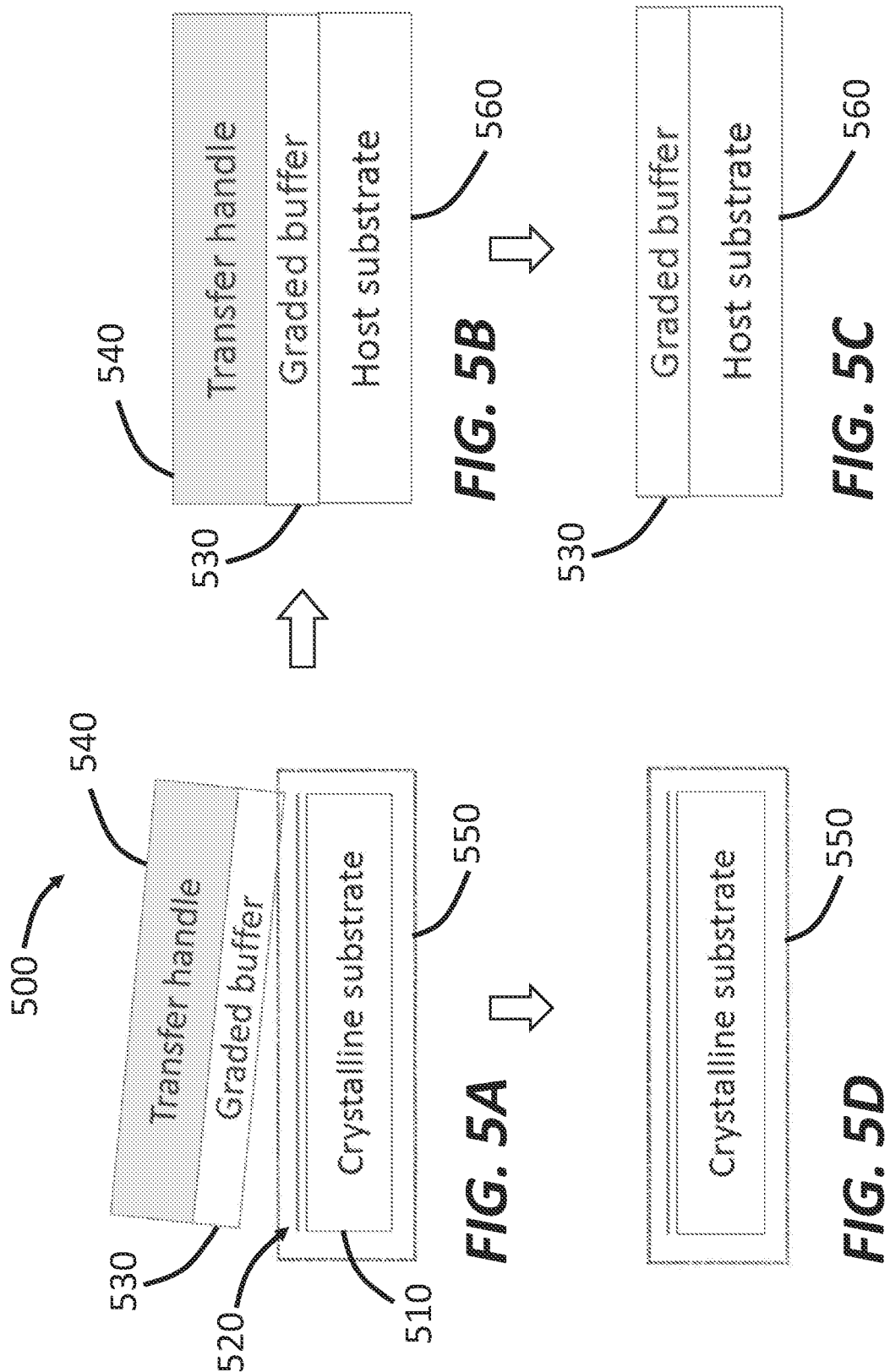

SYSTEMS AND METHODS OF DISLOCATION FILTERING FOR LAYER TRANSFER

CROSS-REFERENCES TO RELATED APPLICATIONS

This application is a national stage filing under 35 U.S.C. § 371 of International Patent Application Serial No. PCT/US2017/060568, filed Nov. 8, 2017, entitled "SYSTEMS AND METHODS OF DISLOCATION FILTERING FOR LAYER TRANSFER," which claims the priority benefit under 35 U.S.C. § 1 19(e) of U.S. Provisional Application No. 62/418,964, filed Nov. 8, 2016, entitled "DISLOCATION-FILTERING TECHNIQUE FOR GRAPHENE-BASED LAYER TRANSFER," each of which is hereby incorporated herein by reference in its entirety.

BACKGROUND

In advanced electronic and photonic technologies, devices are usually fabricated from functional semiconductors, such as III-N semiconductors, III-V semiconductors, II-VI semiconductors, and Ge. The lattice constants of these functional semiconductors typically do not match the lattice constants of silicon substrates. Lattice constant mismatch between a substrate and an epitaxial layer on the substrate can introduce strain into the epitaxial layer, thereby preventing epitaxial growth of thicker layers without defects. Therefore, non-silicon substrates are usually employed as seeds for epitaxial growth of most functional semiconductors. However, non-Si substrates with lattice constants matching those of functional materials can be costly and therefore limit the development of non-Si electronic/photonic devices.

One method to address the high cost of non-silicon substrates is the "layer-transfer" technique, in which functional device layers are grown on lattice-matched substrates and then removed and transferred to other substrates. The remaining lattice-matched substrates can then be reused to fabricate another device layer, thereby reducing the cost. To significantly reduce manufacturing costs, it can be desirable for a layer-transfer method to have the following properties: 1) substrate reusability; 2) a minimal substrate refurbishment step after the layer release; 3) a fast release rate; and 4) precise control of release thickness.

Conventional methods to remove and transfer a device layer from a lattice-matched substrate include chemical lift-off (also referred to as epitaxial lift-off or ELO), optical lift-off (also referred to as laser lift-off or LLO), and mechanical lift-off (also referred to as controlled spalling). Unfortunately, none of these methods has all four desired properties at the same time.

The chemical lift-off technique can be used for lifting off device layers made of III-V semiconductors from GaAs wafers. A sacrificial layer of AlAs is usually epitaxially inserted between the device layer and the substrate. Chemical lift-off selectively etches the sacrificial layer in a wet-chemical solution to release the device layers.

Despite its continuous development over the last three decades, chemical lift-off still has several disadvantages. For example, the release rate is slow owing to slow penetration of chemical etchant through the sacrificial layer (e.g., typically a few days to release a single 8-inch wafer). Second, etching residues tend to become surface contamination after release. Third, chemical lift-off has limited reusability owing to the chemical mechanical planarization (CMP) performed after release to recover the roughened substrate surface into an epi-ready surface. Fourth, it can be challenging to handle released epilayers in the chemical solution.

The optical lift-off technique usually uses a high-power laser to irradiate the back of the lattice-matched substrate (e.g., a transparent sapphire or SiC substrate) and selectively heat the device-substrate interface, causing decomposition of the interface and release of the device layer (e.g., III-N film). This technique can reduce the cost of manufacturing III-N-based light emitting diodes (LEDs) and address the problem of heat accumulation from the device by transferring released III-Ns to a substrate that has high thermal conductivity.

However, optical lift-off has its own limitations. First, because the molten III-N/substrate interface can make the substrate rough, a reconditioning step is usually carried out before reuse, thereby reducing the reusability to less than five times. Second, local pressurization at the interface caused by high-power thermal irradiation can induce cracks or dislocations. Third, the laser scanning speed can be too slow to permit high-throughput.

Controlled spalling can have a higher throughput than optical lift-off. In this technique, high-stress films (also referred to as "stressors") are deposited on the epitaxial film, inducing fracture below the epilayers and resulting in the separation of active materials from the substrate. When sufficient tensile stress is applied to the interface, a $K_{II}$ shear mode can initiate a crack and a $K_I$ opening mode can allow the propagation of the crack parallel to the interface between the epilayer and the substrate. By controlling the internal stress and thickness of the stressor, strain energy sufficient to reach the critical $K_I$ can be provided, leading to fracture of the film/substrate interface. Because the exfoliation occurs via crack propagation, the spalling process can cause rapid release of films.

However, controlled spalling is not mature enough to be used for commercial manufacturing for at least the following reasons. First, because crack propagation generally occurs through cleavage planes that are not always aligned normal to the surface, the surface may need polishing for reuse. Second, a thick stressor is usually used to provide enough energy to separate strong covalent bonds, particularly when working with high Young's modulus materials like III-N semiconductors. Third, the internal stress of the stressor may only be controlled in a narrow range, which constrains the achievable thickness of the resulting spalled film. For example, because the maximum internal stress in a typical Ni stressor is about 1 GPa, the critical Ni thickness under 1 GPa tensile stress to initiate spalling of a GaAs film is about 1.5 µm, which can induce spalling of the GaAs film itself if the GaAs is about 10 µm thick. Therefore, when using a Ni stressor it can be challenging to make a GaAs film less than 10 µm thick, which is a drawback because typically most devices use films that are much thinner.

SUMMARY

Embodiments of the present invention include apparatus, systems, and methods for nanofabrication. In one example, a method of manufacturing a semiconductor device includes forming a first epitaxial layer on a first substrate. The first substrate includes a first semiconductor material having a first lattice constant, and the first epitaxial layer includes a second semiconductor material having a second lattice constant different from the first lattice constant. The method also includes disposing a graphene layer on the first epitaxial layer and forming a second epitaxial layer comprising the second semiconductor material on the graphene layer.

In another example, a method of manufacturing a semiconductor device includes disposing a graphene layer on a first substrate that includes a first semiconductor material having a first lattice constant. The method also includes forming an epitaxial layer on the graphene layer. The epitaxial layer includes a second semiconductor material having a second lattice constant different from the first lattice constant. The method also includes transferring the epitaxial layer to a host substrate.

In yet another example, a method of manufacturing a semiconductor device includes disposing a graphene layer on a first substrate that includes a first semiconductor material having a first lattice constant. The method also includes forming a graded buffer layer on the graphene layer and forming a transfer handle layer on the graded buffer layer. The method also includes transferring the graded buffer layer to a host substrate using the transfer handle layer.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A-1C illustrate a method of fabricating a semiconductor device using a two-dimensional (2D) material layer for dislocation filtering.

FIGS. 2A-2C illustrate a method of fabricating a semiconductor device using remote epitaxy on a 2D material layer.

FIGS. 3A-3E illustrate a method of fabricating a semiconductor device based on a graded buffer layer.

FIGS. 5A-5D illustrate a method of fabricating semiconductor devices on a reusable platform including a 2D material layer.

DETAILED DESCRIPTION

Overview

Figures 4A, 4B:
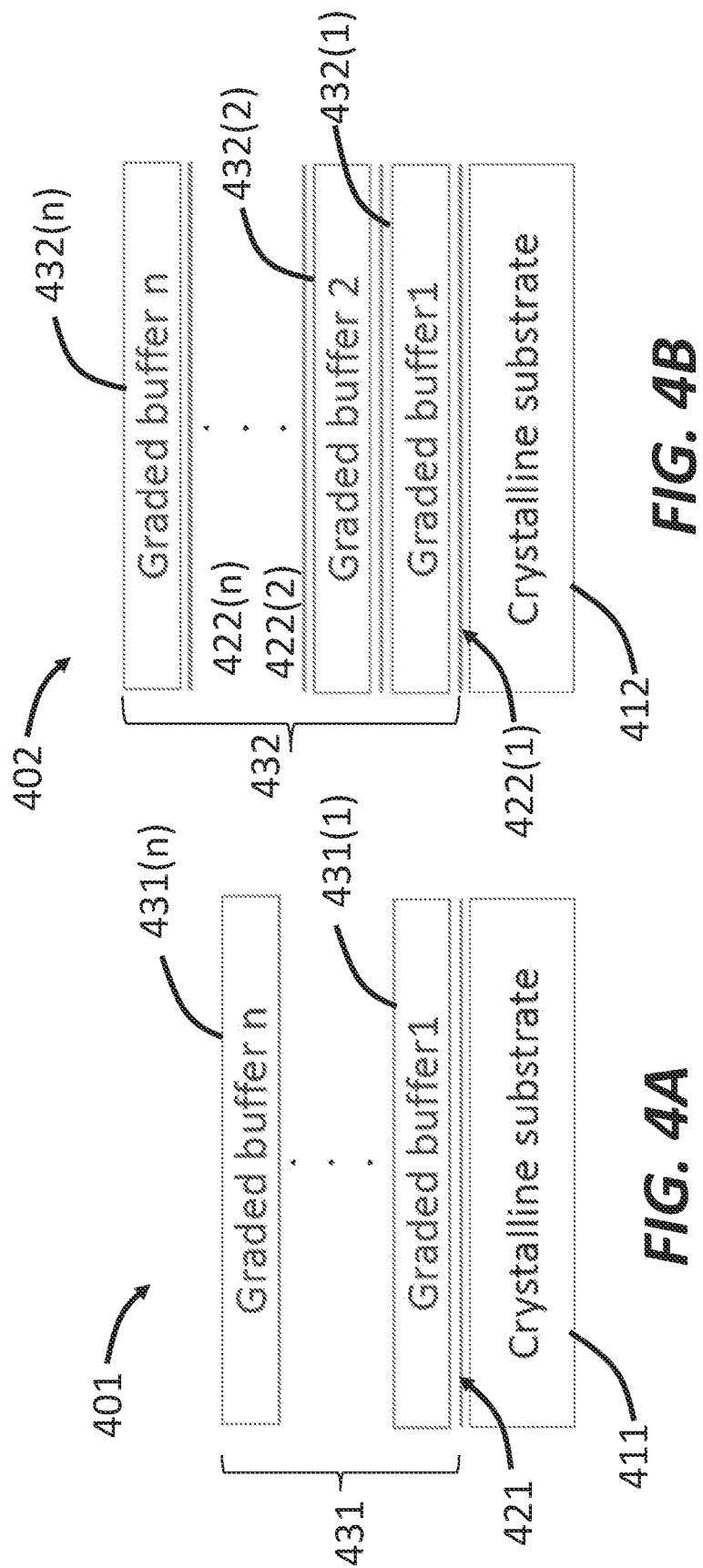
FIGS. 4A and 4B show schematics of graded buffer layers fabricated on a single 2D material layer and multiple 2D material layers, respectively.

As described above, it can be desirable for a layer-transfer process to have substrate reusability, minimal needs for post-release treatment, a fast release rate, precise control of release interfaces, and universality for a wide range of device materials. Conventional layer-transfer processes may exhibit some of the desired properties. For example, layer release is much faster for mechanical lift-off than for chemical or optical lift-off, whereas the release location can be better controlled in chemical and optical lift-off. However, conventional layer-transfer methods suffer from rough surface formation after layer release, thereby limiting substrate reusability. In fact, the process cost to refurbish the substrate surface in conventional layer-transfer methods typically exceeds the substrate cost, so practical applications in manufacturing can be challenging. In addition, each conventional method usually works for a limited number of specific materials (e.g., chemical lift-off for III-V materials, whose lattice is close to that of GaAs, and optical lift-off for materials that can be grown on transparent substrates). Therefore, it is also challenging to make universal use of these methods.

To address the shortcomings in conventional layer-transfer methods, systems and methods described herein employ a layer transfer technique based on a two-dimensional (2D) material (e.g., graphene). The 2D material can perform several functions to facilitate the growth and transfer of functional layers. For example, the 2D material can function as a filter to reduce and/or eliminate dislocation in the functional layer (see, e.g., FIGS. 1A-1C). In this example, the functional layer is epitaxially grown on the 2D material, and the Van der Waals bonding between the functional layer (e.g., made of III-V semiconductor) and the 2D material can physically discontinue the dislocation at the interface.

The 2D material can also function as a release layer that allows fast, precise, and repeatable release at the surface. In this case, remote epitaxy can be combined with spontaneous relaxation to grow functional layers with low dislocation density on the 2D material, which is disposed on a substrate (also referred to as a parent substrate). The functional layers can then be readily transferred to another substrate (also referred to as a host substrate) for further processing (see, e.g., FIGS. 2A-2C), leaving the parent substrate and the 2D material for another cycle of fabrication.

The layer transfer technique can also fabricate and transfer growth substrates. For example, a graded buffer layer can be grown on the 2D material and then transferred to a host substrate to fabricate functional layers (see, e.g., FIGS. 3A-3E). Therefore, this technique can be used to construct a multi-purpose platform to accommodate different manufacturing demands.

Dislocation Filtering for Graphene-Based Layer Transfer

FIGS. 1A-1C illustrate a method 100 of fabricating a semiconductor device using a two-dimensional (2D) material layer for dislocation filtering. In the method 100, a first epitaxially layer 120 is formed on a first substrate 110 as shown in FIG. 1A. The first substrate 110 and the first epitaxial layer 120 can have different lattice structures (e.g., different lattice constants). For example, the first substrate may include a first semiconductor material having a first lattice structure (e.g., a first lattice constant) and the first epitaxial layer 120 may include a second semiconductor material having a second lattice structure different from the first lattice structure (e.g., a second lattice constant).

FIG. 1B shows that a filter layer 130 made of a two-dimensional material (2D) is formed on the first epitaxial layer 120. A second epitaxial layer 140 made of the same material as in the first epitaxial layer 120 is then grown on the filter layer 130 to form a structure 150 (also referred to as a device 150), as shown in FIG. 1C. As described above, the Van der Waals bonding between the second epitaxial layer 140 and the filter layer 130 can physically discontinue the dislocation at the interface, thereby producing high-quality crystalline structures in the second epitaxial layer 140.

The first substrate 110 can include any substrate suitable for epitaxial growth. For example, the first substrate 110 can include GaN and the first epitaxial layer 120 can include InGaN. In another example, the first substrate 110 includes GaAs and the first epitaxial layer 120 includes InGaAs. In yet another example, the first substrate 110 includes InP and the first epitaxial layer 120 includes InGaP. In yet another example, the first epitaxial layer 120 can include silicon carbide (SiC) and the first substrate 110 can include any platform that can be used to prepare SiC.

The materials of the first substrate 110 and the first epitaxial layer 120 usually can have lattice mismatch. Accordingly, the first epitaxial layer 120 can include dislocations. In practice, the lattice mismatch can be about 0% to about 70% (e.g., about 0%, about 10%, about 20%, about 30%, about 40%, about 50%, about 60%, and about 70%, including any values and sub ranges in between). However, the dislocations in the first epitaxial layer 120 not affect the quality of the second epitaxial layer 140 due to the filtering effect of the filter layer 130.

In general, a thicker first epitaxial layer 120 can result in better interface for subsequent processing but it may also take longer time to fabricate the first epitaxial layer 120. In some cases, the thickness of the first epitaxial layer 120 can be about 100 nm to about 10 μm (e.g., about 100 nm, about 200 nm, about 300 nm, about 500 nm, about 1 μm, about 2 μm, about 3 μm, about 4 μm, about 5 μm, about 6 μm, about 7 μm, about 8 μm, about 9 μm, or about 10 μm, including any values and sub ranges in between).

Various types of 2D materials can be used for the filter layer 130. In one example, the filter layer 130 includes graphene (e.g., monolayer graphene or multilayer graphene). In another example, the filter layer 130 includes transition metal dichalcogenide (TMD) monolayers, which are atomically thin semiconductors of the type $MX_2$, with M being a transition metal atom (e.g., Mo, W, etc.) and X being a chalcogen atom (e.g., S, Se, or Te). In a TMD lattice, one layer of M atoms is usually sandwiched between two layers of X atoms. In yet another example, the filter layer 130 can include a single-atom layer of metal, such as palladium and rhodium.

Out of these 2D materials, graphene can have several desirable properties. For example, graphene is a crystalline film and is a suitable substrate for growing epitaxial overlayers. Second, graphene's weak interaction with other materials can substantially relax the lattice mismatching rule for epitaxial growth, potentially permitting the growth of most semiconducting films with low defect densities. Third, epilayers grown on a graphene substrate can be easily and precisely released from the substrate owing to graphene's weak van der Waals interactions, thereby allowing rapid mechanical release of epilayers without post-release reconditioning of the released surface. Fourth, graphene's mechanical robustness can increase or maximize its reusability for multiple growth/release cycles.

The filter layer 130 made of graphene is also referred to as a graphene layer 130 and can be prepared via various methods. For example, the graphene layer 130 can be fabricated on another substrate (also referred to as a parent substrate, not shown in FIGS. 1A-1C). In this example, the graphene layer 130 can include an epitaxial graphene with a single-crystalline orientation and the parent substrate can include a (0001) 4H-SiC wafer with a silicon surface. The fabrication of the graphene layer 130 can include multistep annealing steps. A first annealing step can be performed in $H_2$ gas for surface etching and vicinalization, and a second annealing step can be performed in Argon for graphitization at high temperature (e.g., about 1,575° C.).

In another example, the graphene layer 130 can be grown on the parent substrate via a chemical vapor deposition (CVD) process. The parent substrate can include a nickel substrate or a copper substrate (e.g., to fabricate polycrystalline graphene layers). Alternatively, the parent substrate can include an insulating substrate made of $SiO_2$, $HfO_2$, $Al_2O_3$, $Si_3N_4$, or practically any other high temperature, planar material compatible with CVD.

In yet another example, the parent substrate can be any substrate that can hold the graphene layer 130, and the fabrication can include a mechanical exfoliation process. In this example, the parent substrate can function as a temporary holder for the graphene layer 130.

Various methods can also be used to transfer the graphene layer 130 from the parent substrate to the second substrate. In one example, a carrier film can be attached to the graphene layer 130. The carrier film can include a thick film of Poly(methyl methacrylate) (PMMA) or a thermal release tape and the attachment can be achieved via a spin-coating process. After the combination of the carrier film and the graphene layer 130 is disposed on the first epitaxial layer 120, the carrier film can be dissolved (e.g., in acetone) for further fabrication of the second epitaxial layer 140 on the graphene layer 130.

In another example, a stamp layer including an elastomeric material, such as polydimethylsiloxane (PDMS), can be attached to the graphene layer 130 and the parent substrate can be etched away, leaving the combination of the stamp layer and the graphene layer 130. After the stamp layer and the graphene layer 130 are placed on the first epitaxial layer 120, the stamp layer can be removed by mechanical detachment, producing a clean surface of the graphene layer 130 for further processing.

In yet another example, a self-release transfer method can be used to transfer the graphene layer 130 to the first epitaxial layer 120. In this method, a self-release layer is first spun-cast over the graphene layer 130. An elastomeric stamp is then placed in conformal contact with the self-release layer. The parent substrate can be etched away to leave the combination of the stamp layer, the self-release layer, and the graphene layer 130. After this combination is placed on the first epitaxial layer 120, the stamp layer can be removed mechanically and the self-release layer can be dissolved under mild conditions in a suitable solvent. The release layer can include polystyrene (PS), poly(isobutylene) (PIB) and Teflon AF (poly[4,5-difluoro-2,2-bis(trifluoromethyl)-1,3-dioxole-co-tetrafluoroethylene]).

The fabrication of the second epitaxial layer 140 can be carried out using any suitable semiconductor fabrication technique known in the art. For example, low-pressure Metal-Organic Chemical Vapor Deposition (MOCVD) can be used to grow the second epitaxial layer 140 (e.g., a GaN film) on the filter layer 130. In this example, the filter layer 130 and the first substrate 110 can be baked (e.g., under $H_2$ for >15 min at >1,100° C.) to clean the surface. Then the deposition of second epitaxial layer 140 including GaN can be performed at, for example, 200 mbar. Trimethylgallium, ammonia, and hydrogen can be used as the Ga source, nitrogen source, and carrier gas, respectively. A modified two-step growth process can be employed to obtain GaN epitaxial films on the graphene filter layer 130. The first step can be carried out at a growth temperature of 1,100° C. for a few minutes where guided nucleation at the terrace edges can be promoted. The second growth step can be carried out at an elevated temperature of 1,250° C. to promote the lateral growth. Vertical GaN growth rate in this case can be around 20 nm per min.

The second epitaxial layer 140 is also referred to as a functional layer or a device layer, which can be transferred to another substrate (also referred to as a host substrate, not shown in FIGS. 1A-1C) for further processing to fabricate various types of semiconductor devices. These devices include, for example, solar cells, photodetectors, transistors, light-emitting diodes (LEDs), and semiconductor layers, among others. After the second epitaxial layer 140 is transferred out, the remaining platform, including the filter layer 130, the first epitaxial layer 120, and the first substrate 110, can be used to form another epitaxial layer (e.g., a third epitaxial layer substantially similar to the second epitaxial layer 140). In some cases, the filter layer 130 can be transferred out together with the second epitaxial layer 140. A new filter layer can then be disposed on the first epitaxial layer 120 before the next round of epitaxial growth. More details about transferring and further processing of the second epitaxial layer 140 can be found in PCT Application No. PCT/US2016/050701, filed Sep. 8, 2016, published as International Patent Application Publication No. WO 2017/044577, and entitled "SYSTEMS AND METHODS FOR GRAPHENE BASED LAYER TRANSFER," which is hereby incorporated herein by reference in its entirety.

Layer Transfer Techniques Using Remote Epitaxy

FIGS. 2A-2C illustrate a method 200 of fabricating a semiconductor device using remote epitaxy on a 2D material layer. In the method 200, a 2D material layer 220 (also referred to as a 2D layer 220) is formed directly on a first substrate 210 as shown in FIG. 2A. FIG. 2B shows that an epitaxial layer 230 is grown on the 2D layer 220. The first substrate 210 includes a first semiconductor material having a first lattice constant, and the epitaxial layer 230 includes a second semiconductor material having a second lattice constant different from the first lattice constant. FIG. 2C shows that the epitaxial layer 230 is transferred to a host substrate 240 to form a structure 250 for further processing (e.g., forming semiconductor devices such as solar cells, photodetectors, transistors, LEDs, and semiconductor layers, among others).

Although the first semiconductor material in the first substrate 210 and the second semiconductor material in the epitaxial layer 230 usually have lattice mismatch, the surface of the epitaxial layer 230 can be substantially free of dislocation if the thickness of the epitaxial layer 230 is greater than a threshold value (also referred to as a critical thickness). For example, the thickness of the epitaxial layer 230 can be about 50 nm to about 5 µm (e.g., about 50 nm, about 100 nm, about 200 nm, about 300 nm, about 500 nm, about 1 µm, about 2 µm, about 3 µm, about 4 µm, or about 5 µm, including any values and sub ranges in between). The lattice mismatch between the first semiconductor material and the second semiconductor material can be about 0% to about 70% (e.g., about 0%, about 10%, about 20%, about 30%, about 40%, about 50%, about 60%, and about 70%, including any values and sub ranges in between).

The first substrate 210 can include any substrate suitable for epitaxial growth, and the epitaxial layer 230 can include any material compatible with the first substrate 210. In one example, the first substrate 210 includes GaN and the epitaxial layer 230 includes InGaN. In another example, the first substrate 210 includes GaAs and the epitaxial layer 230 includes InGaP. In yet another example, the first substrate 210 includes InP and the epitaxial layer 230 includes InGaAs.

The 2D layer 220 mostly functions as a release layer in the method 200. In one example, the 2D layer 220 includes graphene, and the thickness of the 2D layer 220 can be substantially equal to or less than 1 nm (e.g., about 1 nm, about 0.9 nm, about 0.8 nm, about 0.7 nm, about 0.6 nm, about 0.5 nm, or less, including any values and sub ranges in between).

The epitaxial layer 230 can be transferred to the host substrate 240 via any of the techniques described herein or in International Application NO. PCT/US2016/050701 Application that is incorporated herein by reference in its entirety. For example, a metal stressor can be formed on the epitaxial layer 230 and a flexible tape can then be disposed on the metal stressor. The epitaxial layer 230 can then be transferred by pulling the epitaxial layer 230 and the metal stressor off the 2D layer 220 with the flexible tape.

The host substrate 240 can include any suitable substrate to hold the epitaxial layer 230 for further processing. Examples of the host substrate 230 can include semiconductor, plastic sheet, and metal foil, among others.

After the epitaxial layer 230 has been moved to the host substrate 240, the remaining platform, including the 2D layer 220 disposed on the first substrate 210, can be used for another round of epitaxial growth. For example, a second epitaxial layer, which can be substantially similar to the epitaxial layer 230, can be grown on the 2D layer 220. In some cases, the new epitaxial layer can be different from the epitaxial layer 230. For example, they can have different thicknesses or different material compositions. This process can be repeated many times (e.g., about 50 times, about 100 times, or more) until, for example, the 2D layer 220 is damaged. At this point, the damaged 2D layer 220 can be removed (e.g., via exfoliation due to the low interaction strength of 2D materials with the first substrate 210) and a new 2D layer can be disposed on the first substrate 210.

Layer Transfer Techniques Using Graded Buffer Layers

FIGS. 3A-3E illustrate a method 300 of fabricating a semiconductor device using a graded buffer layer 300. FIG. 3A shows that a 2D layer 320 is disposed on a first substrate 310. The 2D layer 320 and the first substrate 310 can be substantially similar to the 2D layer 220 and the first substrate 210 shown in FIGS. 2A-2C and described above. FIG. 3B shows that a graded buffer layer 330 is formed on the 2D layer 320. The graded buffer layer 330 includes a first sub layer 332 having a first lattice constant and a second sub layer 334 having a second lattice constant different from the first lattice constant. A handle layer 340 is then formed on the graded buffer layer 330 as illustrated in FIG. 3C. The handle layer 340 can facilitate the transfer of the graded buffer layer 330 to a host substrate 350 as illustrated in FIG. 3D. In FIG. 3E, a device layer 360 is formed (e.g., via epitaxial growth) on the graded buffer layer 330 to form a structure 370 for further processing.

The lattice parameters of the graded buffer layer 330 are preferably selected to achieve lattice matching and an epitaxial relation with the layers that they contact at their extremities. For example, the graded buffer layer 330 can be epitaxial to the first substrate 310, graded in composition through its thickness, and epitaxial to the device layer 360 on the other side. In other words, the first sub layer 332 can be epitaxial to the first substrate 310 and the second sub layer 334 can be epitaxial to the device layer 360.

In FIGS. 3A-3E, only two sub layers (332 and 334) are illustrated. In practice, the number of sub layers in the graded buffer layer 330 can be greater than 2 (e.g., 3 sub layers, 5 sub layers, 10 sub layers, 15 sub layers, 20 sub layers, or more, including any values and sub ranges in between). The lattice constants of the sub layers can be monotonically changing through the thickness of the graded buffer layer 330. The ith sub layer in the graded buffer layer 330 can have a corresponding lattice constant $a_i$. In one example, the lattice constant can monotonically increase along the thickness, i.e., $a_i < a_{i+1}$. Alternatively, the lattice constant can monotonically decrease along the thickness, i.e., $a_i > a_{i+1}$.

The total thickness of the graded buffer layer 330 can depend on the number of sub layers. For example, the total thickness of the graded buffer layer 330 be about 1 μm to about 10 μm (e.g., about 1 μm, about 2 μm, about 3 μm, about 4 μm, about 5 μm, about 6 μm, about 7 μm, about 8 μm, about 9 μm, or about 10 μm, including any values and sub ranges in between). The thickness of each sub layer can be, for example, about 50 nm to about 2 μm (e.g., about 50 nm, about 100 nm, about 200 nm, about 300 nm, about 500 nm, about 1 μm, or about 2 μm, including any values and sub ranges in between).

Using the graded buffer layer 330 can achieve the desired lattice matching and epitaxial relationship through the thickness of the resulting structure shown in FIG. 3E. This lattice matching and epitaxial relationship can reduce internal stresses and strains and promote good electron movement through the thickness of the structure shown in FIG. 3E. The graded buffer layer 330 can also relax the lattice matching of the device layer 360, so that the compositions of the device layer 360 may be configured to produce the desired bandgap for practical functions (e.g., photo conversion in solar cells, or photo detection in photodetectors), instead of producing exact lattice matching.

The distribution of the lattice constant within the graded buffer layer 330 can be controlled by the composition of each sub layer in the graded buffer layer 330. For example, the graded buffer layer 330 can include InGaAs and the lattice constant of the graded buffer layer 330 can be adjusted by changing the In to Ga ratio in each sub layer. In this case, the first substrate 310 can include GaAs and the device layer 360 can include InGaAs. The first sub layer (in contact with the 2D layer 320) in the graded buffer layer 330 can be GaAs (i.e., no In), and the amount of Ga gradually decreases and the amount of In gradually increases until the last sub layer (in contact with the device layer 360) is epitaxial to InGaAs. Similarly, the In to Ga ratio can also be used to change the lattice constant of InGaP.

The handle layer 340 can further include a stressor that is disposed on the graded buffer layer 330 and a tape layer disposed on the stressor for handling the stressor. For example, the stressor can include a high-stress metal film such as a Ni film. In this example, the Ni stressor can be deposited in an evaporator at a vacuum level of $1 \times 10^{-5}$ Torr. Using the tape and the stressor together can mechanically exfoliate the graded buffer layer 330 from the 2D layer 320 at a fast release rate by applying high strain energy to the interface between the graded buffer layer 330 and the 2D layer 320. The release rate can be fast at least due to the weak van der Waals bonding between the 2D material in the 2D layer 320 (e.g., graphene) and the material such as the graded buffer layer 330 (e.g., GaAs).

FIG. 3D also shows that the handle layer 340 is removed, leaving the graded buffer layer 330 for the growth of the device layer 360. In one example, the handle layer (e.g., including the tape layer and the stressor) can be etched away by a $FeCl_3$-based solution.

FIGS. 4A and 4B show schematics of graded buffer layers fabricated on a single 2D material layer and multiple 2D material layers, respectively. FIG. 4A shows a semiconductor device 401 including a graded buffer layer 431 fabricated on a graphene layer 421, which in turn is disposed on a substrate 411. The graded buffer layer 431 includes multiple sub layers 431(1) to 431(n), where n is a positive integer. The number of sub layers n can be, for example, greater than 2 (e.g., 3 sub layers, 5 sub layers, 10 sub layers, 15 sub layers, 20 sub layers, or more, including any values and sub ranges in between). In the system 401, the sub layers 431(1) to 431(n) are directly stacked together without any spacers. During fabrication, the sub layer 432(i+1) is deposited on the sub layer 432(i), i=1, 2, ..., n–1.

FIG. 4B shows a semiconductor device 402 including a graded buffer layer 432 disposed on a substrate 412. The graded buffer layer 432 includes multiple sub layers 432(1), 432(2), ..., 432(n), and adjacent sub layers 432(i) and 432(i+1) are separated by a corresponding graphene layer 422(i+1). In the system 402, the first graphene layer 422(1) is disposed on the substrate 412 on which the first sub layer 432(1) is formed. A second graphene layer 422(2) is then disposed on the first sub layer 432(1), and the process continues until the last sub layer 432(n) is formed. In general, using a graded buffer layer (431 or 432) including multiple sub layers can filter the dislocation multiple times, thereby leading to reduced dislocation in epitaxial layers fabricated on the graded buffer.

FIGS. 5A-5D illustrate a method 500 of fabricating semiconductor devices on a reusable platform including a 2D material layer. In FIG. 5A, a graded buffer layer 530 is removed from a graphene layer 520 using a transfer handle layer 540. The graphene layer 520 is disposed on a substrate 510 to form a reusable platform 550. The graded buffer layer 530 is disposed on a host substrate 560 as shown in FIG. 5B. The handle layer 540 is then removed (e.g., via etching) to expose the surface of the graded buffer layer 530 for further processing (e.g., epitaxial growth of device layers). The reusable platform 550, including the graphene layer 520 disposed on the substrate 510, can be used to form a new graded buffer layer, as shown in FIG. 5D. In one example, the new graded buffer layer can be substantially similar to the graded buffer layer 530. In another example, the new graded buffer layer can be different from the graded buffer layer 530. For example, these two graded buffer layers can have different material compositions or different numbers of sub layers.

In some cases, the reusable platform 550 can be used to fabricate device layers (e.g., epitaxial layer 230 in FIGS. 2A-2C). Accordingly, the reusable platform 550 can be configured as a multi-function platform to accommodate different fabrication demands (e.g., fabricate device layers at one time and fabricate graded buffer layers at another time, without changing hardware components in the platform 550).

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of manufacturing a semiconductor device, the method comprising:
    forming a first epitaxial layer on a first substrate, the first substrate comprising a first semiconductor material having a first lattice constant and the first epitaxial layer comprising a second semiconductor material having a second lattice constant different from the first lattice constant;
    disposing a graphene layer on the first epitaxial layer; and
    forming a second epitaxial layer comprising the second semiconductor material on the graphene layer,
    wherein the graphene layer physically separates the first epitaxial layer and the second epitaxial layer.

2. The method of claim 1, wherein the first substrate comprises GaN and the first epitaxial layer comprises InGaN.

3. The method of claim 1, wherein the first substrate comprises GaAs and the first epitaxial layer comprises InGaP.

4. The method of claim 1, wherein the first substrate comprises InP and the first epitaxial layer comprises InGaAs.

5. The method of claim 1, wherein disposing the graphene layer comprises:
    forming the graphene layer on a second substrate; and
    transferring the graphene layer from the second substrate to the first epitaxial layer.

6. The method of claim 5, wherein the second substrate comprises silicon carbide and the graphene layer comprises a single-crystalline graphene layer.

7. The method of claim 5, wherein the second substrate comprises a copper foil and the graphene layer comprises a poly-crystalline graphene layer.

8. The method of claim 1, further comprising:
transferring the second epitaxial layer to a host substrate.

9. The method of claim 8, wherein transferring the second epitaxial layer comprises exfoliating the second epitaxial layer from the graphene layer and disposing the second epitaxial layer on the host substrate.

10. The method of claim 8, wherein transferring the second epitaxial layer comprises:
forming a metal stressor on the second epitaxial layer;
disposing a flexible tape on the metal stressor; and
pulling the second epitaxial layer and the metal stressor off the graphene layer with the flexible tape.

11. The method of claim 8, further comprising:
forming a third epitaxial layer comprising the second semiconductor material on the graphene layer after transferring the second epitaxial layer to the host substrate.

12. A semiconductor device formed by the method of claim 1.

13. The method of claim 1, wherein a single monolayer of graphene is present between the first epitaxial layer and the second epitaxial layer.

* * * * *